(12) United States Patent
Kaufmann et al.

(10) Patent No.: US 7,701,028 B2
(45) Date of Patent: Apr. 20, 2010

(54) IMAGE SENSOR WITH LARGE-AREA, HIGH-SENSITIVITY AND HIGH-SPEED PIXELS

(75) Inventors: Rolf Kaufmann, Zurich (CH); Michael Lehmann, Winterthur (CH); Peter Seitz, Urdorf (CH)

(73) Assignee: MESA Imaging AG, Zurich (CH)

( * ) Notice: Subject to any disclaimer, the term of this patent is extended or adjusted under 35 U.S.C. 154(b) by 551 days.

(21) Appl. No.: 10/594,642

(22) PCT Filed: Mar. 31, 2005

(86) PCT No.: PCT/CH2005/000184

§ 371 (c)(1),
(2), (4) Date: Sep. 28, 2006

(87) PCT Pub. No.: WO2005/096383

PCT Pub. Date: Oct. 13, 2005

(65) Prior Publication Data

US 2007/0187724 A1    Aug. 16, 2007

(30) Foreign Application Priority Data

Mar. 31, 2004  (EP) .................................. 04007760

(51) Int. Cl.
*H01L 31/075* (2006.01)
(52) U.S. Cl. ...................... 257/458; 257/293; 257/443; 257/449; 257/452; 257/462; 257/466; 257/626
(58) Field of Classification Search ................. 257/458, 257/293, 443, 449, 452, 462, 466, 626

See application file for complete search history.

(56) References Cited

U.S. PATENT DOCUMENTS 4,245,233 A    1/1981  Lohstroh .................... 307/311

(Continued)

FOREIGN PATENT DOCUMENTS

EP    0 862 226    9/1998

(Continued)

OTHER PUBLICATIONS

Gatti, E. et al., "Semiconductor Drift Chamber—An Application of a Novel Charge Transport Scheme," Nuclear Instruments and Methods in Physics Research, vol. 225, pp. 608-614, 1984.

(Continued)

*Primary Examiner*—Michael B Shingleton
(74) *Attorney, Agent, or Firm*—Houston Eliseeva LLP

(57) ABSTRACT

The pixel for use in an image sensor comprises a low-doped semiconductor substrate (A). On the substrate (A), an arrangement of a plurality of floating areas e.g., floating gates (FG2-FG6), is provided. Neighboring floating gates are electrically isolated from each other yet capacitively coupled to each other. By applying a voltage (V2-V1) to two contact areas (FG1, FG7), a lateral steplike electric field is generated. Photogenerated charge carriers move along the electric-field lines to the point of highest potential energy, where a floating diffusion (D) accumulate the photocharges. The charges accumulated in the various pixels are sequentially read out with a suitable circuit known from image-sensor literature, such as a source follower or a charge amplifier with row and column select mechanisms. The pixel of offers at the same time a large sensing area, a high photocharge-detection sensitivity and a high response speed without any static current consumption.

22 Claims, 4 Drawing Sheets

U.S. PATENT DOCUMENTS

| | | | |
|---|---|---|---|
| 4,688,067 | A | 8/1987 | Rehak et al. |
| 4,788,581 | A | 11/1988 | Knoll et al. |
| 4,885,620 | A | 12/1989 | Kemmer et al. ............... 357/24 |
| 5,164,832 | A | 11/1992 | Halvis et al. |
| 5,528,643 | A | 6/1996 | Hynecek ...................... 377/60 |
| 6,229,192 | B1 * | 5/2001 | Gu ............................. 257/458 |
| 6,249,033 | B1 | 6/2001 | Castoldi et al. |
| 2002/0057356 | A1 | 5/2002 | Tanabe |

FOREIGN PATENT DOCUMENTS

| | | |
|---|---|---|
| WO | WO 04/001354 | 12/2003 |

OTHER PUBLICATIONS

Gatti, E. et al., "Silicon Drift Chambers—First Results and Optimum Processing of Signals," Nuclear Instruments and Methods in Physics Research, vol. 226, pp. 129-141, 1984.

Kemmer, J. et al., "New Detector Concepts," Nuclear Instruments and Methods in Physics Research, vol. A253, pp. 365-377, 1987.

Seitz, P. et al., "Smart optical and image sensors fabricated with industrial CMOS/CCD semiconductor processes," Proc. SPIE vol. 1900, p. 21-30, Charge-Coupled Devices and Solid State Optical Sensors III, Feb. 2-3, 1993.

Seitz et al., "Smart Optical and Image Sensors Fabricated with Industrial CMOS/CCD Semiconductor Processes", Proceedings Reprint, *SPIE—The International Society for Optical Engineering*, vol. 1900, pp. 21-30 (1993).

Seitz, P., "Solid-State Image Sensing", *Handbook of Computer Vision and Applications*, (Jähne et al., Eds.), Academic Press, San Diego, vol. 1, pp. 111-151 (2000).

Schwarte, R., et al: "New optical four-quadrant phase-detector integrated into a photogate array for small and precise 3D-cameras." Proceedings of the SPIE, SPIE, Bellingham, VA, US, vol. 3023, Feb. 11, 1997, pp. 119-128.

* cited by examiner

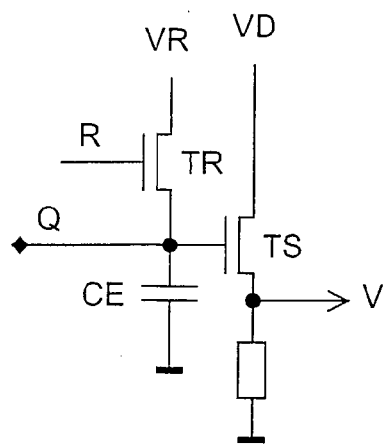 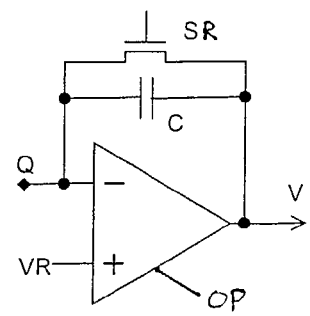 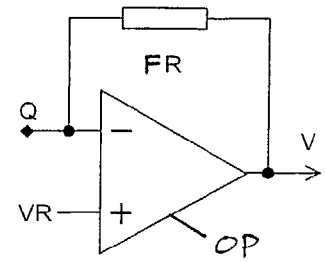
Fig. 3(a)          Fig. 3(b)          Fig. 3(c)
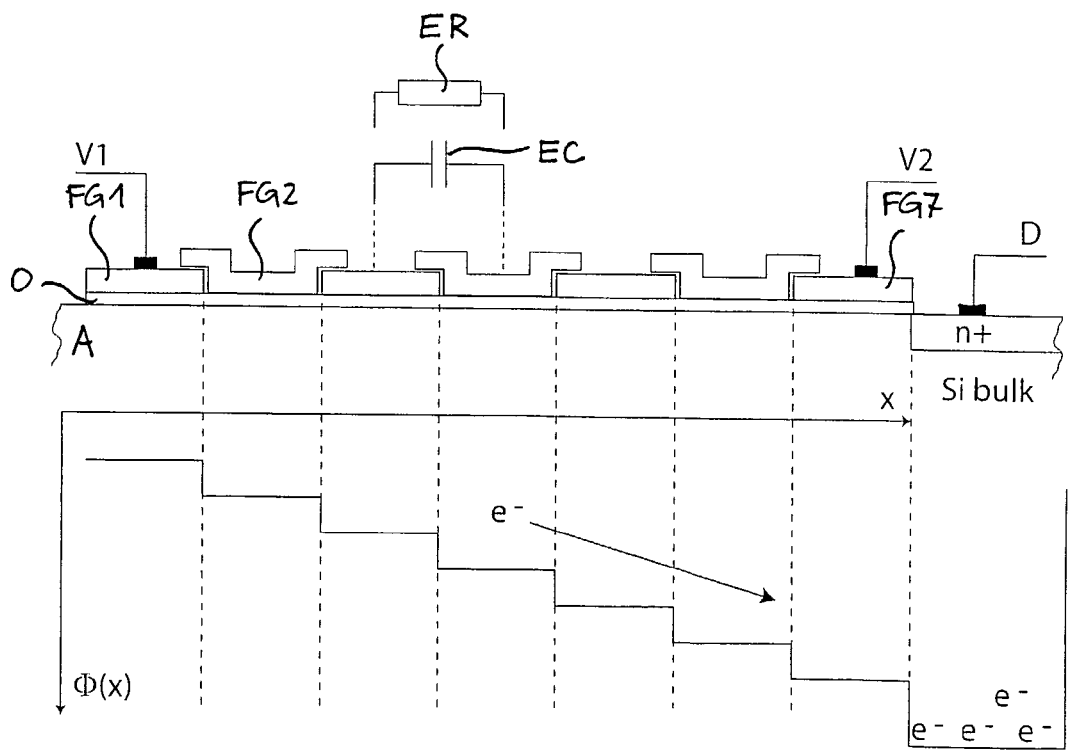
Fig. 10

IMAGE SENSOR WITH LARGE-AREA, HIGH-SENSITIVITY AND HIGH-SPEED PIXELS

RELATED APPLICATIONS

This application is a §371 National Phase Application of PCT/CH2005/000184, filed on Mar. 31, 2005, and claims priority to European Application No. EP 04007760.4, filed on Mar. 31, 2004, both of which are incorporated herein by reference in their entirety.

FIELD OF THE INVENTION

This invention relates to solid-state photosensing. In particular, it relates to complementary-metal-oxide-semiconductor (CMOS), active-pixel-sensor (APS) or charge-coupled-device (CCD) photosensors, in which large pixel areas of more than 25 square microns are required, and at the same time a high quantum efficiency, a high photocharge detection sensitivity and a high response speed are needed. It also relates to pixels for such photosensors and to a method for sensing incident radiation with such pixels. This invention is suited for all photosensing and particle-sensing applications such as X-ray, gamma-ray, deep-ultraviolet (UV) or atom-beam imaging.

BACKGROUND OF THE INVENTION

Solid-state image sensors and cameras find more and more applications in areas where it is difficult to focus the incident electromagnetic or particle radiation with optical means. This is particularly true for X-rays, gamma rays, high-energy ultraviolet light (with wavelengths below 100 nm) and neutral beams of atoms. At the same time, the absolute level of incident radiation intensity is often very low, making it desirable to acquire images of this incident radiation with pixels that are at the same time highly sensitive and quite large. Such large pixels should have an area of 25 square microns or much more, e.g., up to several square centimeters, which could be of interest in X-ray applications.

The image-sensor pixels known from literature are either of the photodiode or the metal-oxide-semiconductor (MOS) device type, as described for example in P. Seitz, "Solid-State Image Sensing", in Computer Vision and Applications—A Guide for Students and Practitioners (B. Jahne and H. Haussecker, Eds.), pp. 111-151, Academic Press, San Diego, 2000. In such photosensors, the photocharge-detection sensitivity varies with the inverse of the pixel's capacitance. This capacitance, on the other hand, increases in direct proportion with the pixel area. For this reason, it is not possible to realize such conventional photosensors that are at the same time very large, highly sensitive and fast.

A first method to overcome this contradiction is taught in U.S. Pat. No. 4,245,233. An MOS structure is described, consisting of a highly resistive layer on top of an insulator covering a semiconductor. A voltage difference is applied to the two ends of the highly resistive layer, creating a spatially varying potential distribution at the interface between semiconductor and insulator. Incoming photons generate charges in the bulk of the semiconductor, and the photogenerated charges move to the semiconductor interface essentially by diffusion. Once they are close to the semiconductor-oxide interface, they notice the spatially varying surface potential, and they move along the electric field lines to the region with the attracting potential energy, at one end of the device. At this place a diffusion at the semiconductor surface is employed to collect the photocurrent, making use of a transimpedance circuit that keeps the diffusion at a fixed potential. Since this type of photosensor makes use of a transimpedance circuit, the complete device covers a large area. Therefore, it is only useful, in practice, for single photodetectors or, at most, for a linear array of photodetectors that offer at the same time large areas and high charge-detection sensitivity.

A method that allows the realization of two-dimensional arrays of large-area, sensitive pixels is described by P. Seitz et al. in "Smart optical and image sensors fabricated with industrial CMOS/CCD semiconductor processes", Proc. SPIE, Vol. 1900, 21-30, 1993. The so-called "charge-binning" method makes use of standard CCD technology and employs a special charge transport/accumulation technique. The CCD gates are clocked such that charge packets from different pixels are accumulated under one gate. Thus, this summed charge can be read out instead of reading out all pixel charge packets individually. In a two-dimensional CCD image sensor it is possible to employ this charge-binning method to realize two-dimensional areas of an effective photosensitive size ("super pixels") that is much larger than the one of individual pixels, and these super pixels can even have non-rectangular shape. However, this implies the use of industry-standard CCD technology for the fabrication of CCD image sensors, as well as suitable CCD clocking circuitry and schemes with the associated system complexity and high electric power consumption.

U.S. Pat. No. 5,528,643 describes the fast lateral transport of photogenerated charge carriers, by employing a series of CCD gates, each of which has contacts at both ends at which voltage differences can be applied. In this way, each CCD electrode exhibits a lateral drift field at the semiconductor-insulator interface. The object of invention is the architecture of a two-dimensional CCD image sensor with improved photocharge transport speed in the column and read-out line directions. As in the charge-binning approach described above, the teaching of said patent necessitates CCD clocking circuitry and clocking schemes. Again, system complexity and power consumption are rather high.

An alternate structure without clocked electrodes is taught in U.S. Pat. No. 4,885,620, describing so-called "drift detectors", which are especially used for the detection of particles and ionizing radiation. Because of the large penetration depth of this form of incident radiation, the detectors must have three-dimensional structures. They produce a lateral drift field in the center of a fully depleted wafer using electrodes and floating implants on both sides (top and bottom) of the wafer. An impinging particle creates an electron-hole cloud along its trajectory. These charge-carriers then drift sideways along the lateral electric field and are read out at the side electrode which has the highest or lowest potential, respectively. From the time between the particle impact and the arrival of the charge carriers at the read-out node one can calculate the lateral position of the particle's trajectory. Such devices are dedicated to the measurement of spatial coordinates of particle trajectories and not to demodulation purposes. Furthermore, they need a double-sided wafer-processing and the application of high voltages to fully deplete the wafer, making it impossible to fabricate them with industry-standard CMOS or related semiconductor processes.

The publication WO-2004/001354 discloses an image-sensing device and a method for detecting and demodulating modulated wavefieds. Each pixel consists of a resistive, transparent electrode on top of an insulated layer that is produced over a semiconducting substrate whose surface is electrically kept in depletion. The electrode is connected with two or more contacts to a number of clock voltages that are operated synchronously with the frequency of the modulated wave field. In the electrode and in the semiconducting substrate, lateral electric fields are created that separate and transport photogenerated charge pairs in the semiconductor to respective diffusions close to the contacts. By repetitively storing and accumulating photocharges in the diffusions, electrical signals are generated that are subsequently read out for the determination of local phase shift, amplitude and offset of the modulated wave field. This device also consumes large amounts of electric power.

EP-0,862,226 A2 describes planar structures for the detection of electromagnetic and particle radiation. In contrast to CCD structures, where an array of gate electrodes is placed on an insulating layer, it makes use of an array of diffusions in a semiconductor substrate for the lateral charge transport. In both cases, however, each gate or diffusion electrode must be wired individually, and it is connected to its own, particular voltage source. According to EP-0,862,226 A2, the preferred means for generating the different voltages is a voltage divider crated with a tapped resistor. As a consequence, the generation of these voltages requires the flow of a current and, therefore, the dissipation of electrical power. Furthermore, the silicon wafer bulk has to be fully depleted for an operation of the device. In order to deplete an average wafer thickness of approximately 300 μm, a potential difference in the order of several hundred Volts is needed.

U.S. Pat. No. 4,788,581 describes an MOS dosimeter with floating metal gates. However, the generated charges are collected on the metal gates, not in the substrate. No dump mechanism for quickly reading out the charges is provided, nor is such a mechanism possible in the MOS dosimeter. Therefore, the dosimeter is not suitable for imaging purposes, where the pixels have to be aligned in a large array and where a fast sequence of images is required.

SUMMARY OF THE INVENTION

It is an object of the invention to provide a pixel, a solid-state image sensor and a method for the sensing of electromagnetic or particle radiation fields that are either quasi-static or temporally modulated. The pixels of the sensor should offer at the same time a large sensing area, a high photo-charge-detection sensitivity and a high response speed, without any static current consumption. The disadvantages of the prior art should be avoided.

These and other objects are solved by the pixel, the image sensor and the method as defined in the independent claims. Advantageous embodiments are defined in the dependent claims.

The traditional construction of photosensitive devices relies either on a photodiode or a metal-oxide-semiconductor (MOS) structure for the creation of a vertical electric field close to the surface of a semiconductor. Photogenerated charges are separated in this electric field, and they are stored on the capacitance represented by the photodiode or the MOS structure. Since the same device is used for the separation as well as the storage of photocharges, it is difficult to really use this principle for pixels of a photosensor that offer at the same time large area and high charge detection sensitivity.

Thus, the following two main tasks of a pixel can be identified:

(i) the task of converting incident radiation into charge pairs, of separating and transporting them; and (ii) the task of accumulating and electronically detecting the photocharge.

According to the invention, these two tasks are geometrically and electrically separated and realized with two distinct semiconductor structures.

The first task (i) is realized with an array of photogates or implants. Of these gates or implants only a few are contacted such that a lateral electric field towards one contact emerges. The remaining, uncontacted (floating) gates or implants will take on an intermediate potential due to capacitive coupling or the punch-through mechanism, respectively. Photogenerated charge carriers move along the lateral electric field lines to the point of lowest potential energy, where a floating diffusion or a floating gate accumulates the photocharges. The charges of the different pixel sites are sequentially read out with a suitable circuit known from image-sensor literature, such as a source follower or a charge amplifier with row- and column-select mechanisms.

Thus, the pixel for use in an image sensor according to the invention is formed in a semiconductor substrate processed on one side only. It comprises an active area for converting incident radiation into charge carriers of a first and a second charge type, charge-separation means located in said active area for separating said charge carriers of the first charge type from said charge carriers of the second charge type, and charge-storage means for storing charge carriers of at least one charge type, said charge-storage means being located in a charge-storage area which is laterally adjacent to said active area, but geometrically separated and electrically isolated from said active area. Said charge-separation means comprise at least one floating area and at least two contact areas provided with electric contacts for applying a voltage to said at least two contact areas. Said contact areas are electrically isolated from said at least one floating area yet electrically coupled to at least one of said at least one floating area. In a preferred embodiment, said charge-separation means comprise an arrangement of a plurality of floating areas, the arrangement being such that neighboring floating areas are electrically isolated from each other yet electrically coupled to each other. Said at least one floating area and said at least two contact areas preferably have the same structure.

The method according to the invention for sensing incident radiation comprises the steps of: converting the incident radiation into charge carriers of a first and a second charge type in an active area of a semiconductor material processed on one side only, generating a lateral electric field at the semiconductor surface in said active area for separating said charge carriers of the first charge type from said charge carriers of the second charge type, and storing charge carriers of at least one charge type in a charge-storage area which is laterally adjacent to said active area, but geometrically separated and electrically isolated from said active area. Said lateral electric field is a steplike lateral electric field.

The pixel according to the invention can be operated (a) in a pseudo-static or (b) in a dynamic operation mode.

(a) In the pseudo-static operation mode, the applied voltages are kept constant during the exposure time. This operation mode is especially useful for applications with low-signal charge levels, like X-ray imaging, surveillance applications, etc.

(b) In the dynamic operation mode, the applied voltages are periodically changed, e.g., reversed. With such a temporal change of the potential configuration, a modulated electromagnetic wave field can be demodulated. Based on the time-of-flight (TOF) principle, range information on the objects in the scene can be gathered. Thus, the image sensor according to the invention is capable of three-dimensional imaging in real time.

The device according to the present invention overcomes the disadvantages of the prior art by providing pixels for one-dimensional or two-dimensional photosensors that offer at the same time a large photosensitive area, a large photocharge detection sensitivity and high speed without any static current consumption. The operation of these pixels is either completely static, and no clocking circuitry and schemes are required, or it can be dynamic for the demodulation of modulated wave fields.

The semiconductor substrate used for the invention is processed on one side only; it does not require any double-sided structuring and processing. Therefore, the pixel and image sensor according to the invention can be fabricated with completely planar, one-sided technology, exploiting commercially available standard semiconductor processes such as any of the CMOS processes.

Since the present invention does not make any attempt at determining neither the energy of the incident radiation nor its lateral position within a pixel nor its exact time of interaction, it does not intend any charge transport inside the semiconductor substrate. The charge-transport processes in the pixel according to the invention are limited to a depth of less than 10 μm, and preferably less than 5 μm, beneath the processed surface of the semiconductor substrate.

A depletion of the semiconductor substrate is not required for operating the pixel and image sensor according to the invention. The devices according to the invention rather work with standard, CMOS-compatible potentials below 5 V.

The floating areas need not be contacted or wired, and it is not necessary to generate any particular voltages to be applied to the floating areas. The electric potentials of the floating areas are given by capacitive coupling or the punch-through effect. Therefore, the static operation of the pixel according to the invention does not consume any electrical power.

Summing up, the present invention is much simpler and more efficient to realize than the devices according to the prior art.

Throughout this document, the term "radiation" is used for any kind of electromagnetic radiation, such as visible light, infrared (IR) or ultraviolet (UV) radiation, and also for particle radiation such as fast electrons (beta rays), protons or neutrons. The term "floating" means that the so denoted areas are not electrically contacted, neither by a direct electric line nor by any resistive structures.

BRIEF DESCRIPTION OF THE DRAWINGS

Embodiments of the invention are described in greater detail hereinafter relative to the attached schematic drawings.

FIG. 3 shows three examples of known electronic photocharge readout circuits usable for reading out the pixels according to the invention.

FIGS. 8-10 show cross sections of three further embodiments of pixels according to the invention.

DESCRIPTION OF PREFERRED EMBODIMENTS

Figure 1:
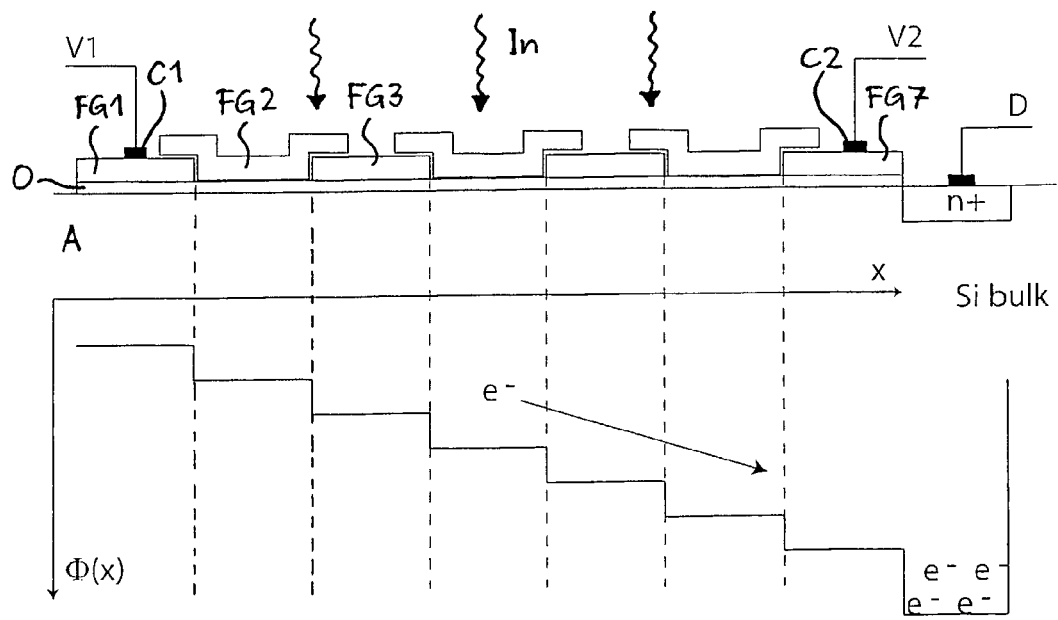
FIG. 1 shows a cross section through a first embodiment of a pixel according to the invention, with floating gates.

FIG. 1 shows a cross section through a first embodiment of a pixel according to the invention, offering a large active area, a high photocharge-detection efficiency for incident radiation In and a high response speed. On a semiconductor substrate A, a plurality of photogates FG1-FG7 are arranged. The substrate A may be, e.g., made of bulk silicon of the p doping type. However, other materials such as Germanium and/or other doping types such as the n doping type can be used for the substrate; for such alternatives, the person skilled in the art will be able to make the necessary adaptations to the embodiments described here. The photogates FG1-FG7 are typically made of undoped or doped polysilicon. They are electrically isolated from each other, e.g., by an oxide layer (not shown) in which they are preferably embedded. A thin (preferably 1-500 nm thick) insulator layer O, e.g., a silica layer, separates the substrate A from the photogates FG1-FG7.

The photogates FG1-FG7 and the insulator layers should be at least partially transparent for the incident radiation In. Alternatively, the arrangement of photogates FG1-FG7 may have openings so that the incident radiation In can be transmitted into the bulk of the semiconductor substrate A. Finally, it is also possible to thin the semiconductor substrate A to a thickness of several micrometers, and to let the radiation In impinge from the back of the device, as in so-called back-illuminated photodetectors.

The two furthest photogates FG1, FG7 are each contacted by an electric contact C1, C2. When two different voltages V1 and V2 are applied to the contacts C1 and C2, respectively, the intermediate floating gates FG2-FG6 take on an intermediate potential due to capacitive coupling. As a consequence, a discrete, steplike potential distribution Φ(x) is generated which depends on the horizontal coordinate x. The potential distribution Φ(x) acts across the insulator O at the interface between semiconductor substrate A and insulator O. Charge carriers, e.g., electrons e−, generated in the substrate A by the incident radiation In move along the lateral electric field lines to the point of highest potential energy, e.g., C2 in case that V2 is larger than V1. Thus, according to the invention, the charge-separation and -transport task is taken over by a lateral electric field at the surface of the substrate A.

The charge-accumulation and -detection task is realized close to the contact C2 providing maximum potential. For this purpose, an n+ doped floating diffusion volume D is provided on the surface of substrate A in which the photogenerated charge carriers are accumulated. The diffusion volume D is contacted by an electric contact for applying a voltage and reading out the photocharges. The potential of the accumulation diffusion D must be higher than the electrode-contact voltage V2, so that the minority carrier photoelectrons are stored in the diffusion D. Examples for electronic photocharge readout circuits are given in FIGS. 3(a)-(c). Alternatively, the photocharges can first be integrated below an integration gate and subsequently be read out through the diffusion volume D; cf. FIG. 8.

Figure 2:
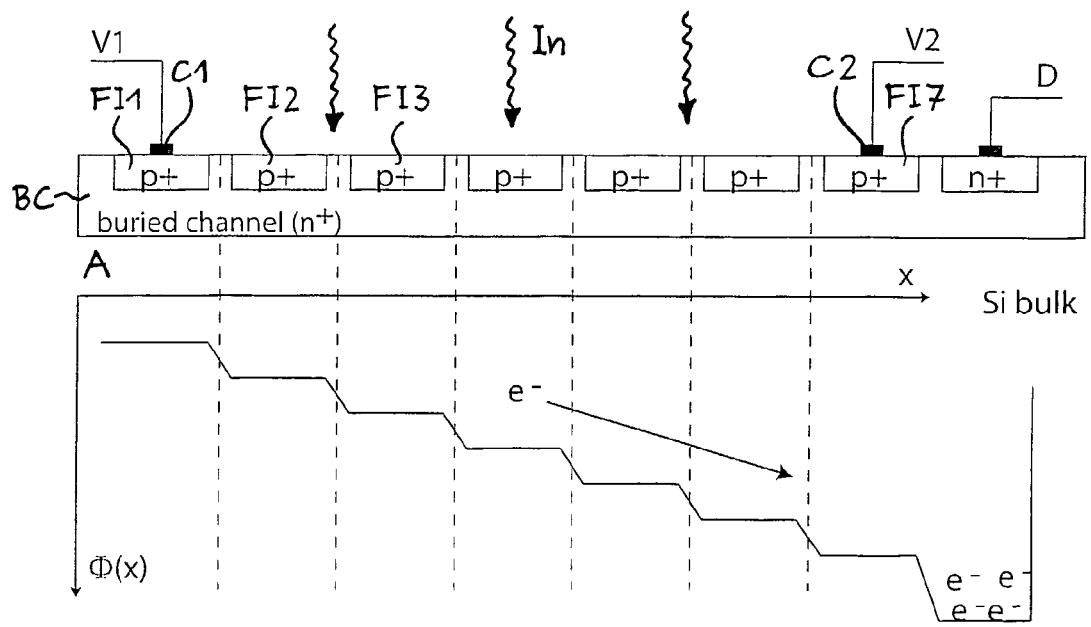
FIG. 2 shows a cross section through a second embodiment of a pixel according to the invention, with floating implants.

FIG. 2 shows a cross section through a second embodiment of a pixel according to the invention. In this embodiment, an array of implants FI1-FI7 is arranged on the surface of a semiconductor substrate A. The substrate A may be, e.g., made of bulk silicon of the p doping type. The implants FI1-FI7 may be p+ implants in an n+ buried channel BC.

The function of the second embodiment of FIG. 2 is analogous to that of the first embodiment of FIG. 1. The two furthest implants FI1, FI7 are each contacted by an electric contact C1, C2, and two different voltages V1 and V2 are applied to the contacts C1 and C2, respectively. The intermediate floating implants FI2-FI6 take on an intermediate potential due to the punch-through mechanism. Thus an approximately discrete, step-shaped potential distribution $\Phi(x)$ is generated. The photogenerated charge carriers, e.g., electrons e−, are detected in an n+ doped floating diffusion volume D in which they are accumulated.

If photoelectrons are to be collected, the substrate A should be p doped. The accumulation diffusion D is of n+ type, and the voltages V1, V2 at the electrode contacts C1, C2 are such that the most positive voltage is applied to the contact C2 that is closest to the accumulation diffusion D. The voltages must be high enough so that a depletion zone extends from the semiconductor-oxide interface into the semiconductor substrate A. The potential of the accumulation diffusion D must be higher than the electrode contact voltage V2, so that the minority carrier photoelectrons are stored in the diffusion D.

If photogenerated holes are to be collected, the substrate A should be n doped. The accumulation diffusion D is of p+ type, and the voltages V1, V2 at the electrode contacts C1, C2 are such that the most negative voltage is applied to the contact C2 that is closest to the accumulation diffusion D. The voltages must be low enough so that a depletion zone extends from the semiconductor-oxide interface into the semiconductor substrate A. The potential of the accumulation diffusion D must be lower than the electrode contact voltage V2, so that the minority carrier holes are stored in the diffusion D.

The number of photogates FG1-FG7 or floating implants FI1-FI7 arranged in one direction x depends on the pixel size (length in x direction) and on the voltage V2-V1 applied. Typically, it is between four and twenty, but may also exceed these limits. There must be at least two contact gates FG1, FG7 or contact implants FI1, FI7, respectively, and at least one floating area between the two contact areas. In the examples of FIGS. 1 and 2, the contact areas have the same structure as the floating areas, i.e., they are designed as photogates or as implants, respectively, in the same manner as the corresponding floating areas. This is a preferred, but not necessary feature of the invention.

The photogenerated charges e− that are stored in the accumulation diffusion D can be detected with circuits known from literature. A first example is the source follower illustrated in FIG. 3(a). The accumulated photocharge Q is placed on the gate of a source-follower transistor TS, whose drain is at a drain voltage VD, whose gate is connected to a reset transistor TR, and whose source is connected to a load resistor. Due to the existence of an effective charge-integration capacitance CE at the gate of the source-follower transistor TS, the photocharge Q is converted into a gate voltage VG=Q/CE. This voltage VG is essentially reproduced by the source-follower transistor TS at its output and can be seen as output voltage V over a load resistor of the source-follower transistor TS. Depending on the operational conditions of the source-follower transistor TS, the output voltage V is usually a fraction of VG between 0.5 and 0.9. After the measurement, the photocharge Q can be dumped through the reset transistor TR via a reset gate R, which is used to reset the gate of the source-follower transistor TS to a reference potential VR.

A second example of an electronic photocharge detector circuit is the charge amplifier circuit illustrated in FIG. 3(b). The positive input + of an operational amplifier OP is kept at a reference potential VR, while the negative input − has a feedback connection to the output with a capacitance C and a reset switch SR in parallel. Photogenerated charge Q at the negative input − is converted into an output voltage V given by V=Q/C. After the measurement, the output voltage V is reset to the reference potential VR by closing the reset switch S momentarily.

A third example of an electronic photocharge detector circuit is the transimpedance amplifier circuit illustrated in FIG. 3(c). The positive input + of an operational amplifier OP is kept at a reference potential VR, while the negative input— has a feedback connection to the output with a feedback resistor FR. A photocurrent I at the negative input—(given as charge Q per time unit t) produces an output voltage V given by V=I·R.

Figure 4:
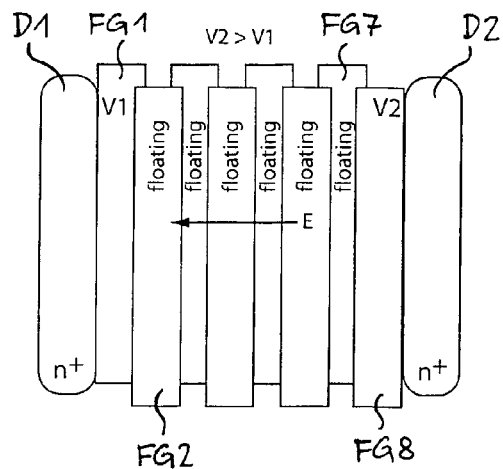
FIGS. 4 and 5 show top views on two different embodiments of a pixel with floating gates according to the invention.
Figure 5:
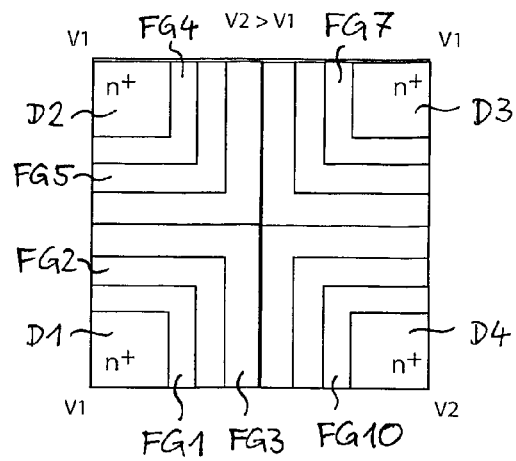

FIGS. 4 and 5 show top views on two different embodiments of a pixel with contact gates FG1, FG7 (FIG. 4) or FG1, FG4, FG7, FG10 (FIG. 5), respectively, and floating gates FG2, FG3, . . . according to the invention. It can be implemented with one or two possible drift directions and two accumulation diffusions D1 and D2, as illustrated in FIG. 4, or with more than two, e.g., four, drift directions and, e.g., four accumulation diffusions D1-D4, as illustrated in FIG. 5.

Generally, overlapping or neighboring photogates FG1, FG2 are capacitively coupled through their overlap and through the substrate A. Especially when using high modulation frequencies for the potential at both ends, the potential in the floating gates FG2-FG7 will follow these changes and therefore assist the lateral drift field through a smooth potential gradient between V1 and V2.

To absorb charges on the gates collected during processing of the substrate wafer, the gates FG1, FG2, . . . can be connected to an appropriate voltage through a high-ohmic path (not shown), which does not degrade the non-static performance. Since the connection can be made very highly resistive, unlike the MOS structure described in U.S. Pat. No. 4,245,233, there is no static current flowing through the gates FG1, FG2, . . . .

The photocharges e− can be collected below a specially dedicated integration gate or on an output n+ implant when using a p type substrate A. The size of this implant defines the conversion gain of the pixel (read-out capacitance). With such a setup, the optically active sensor surface is decoupled from the read-out capacitance. The successive read-out of the photocharges happens then with one of the circuits shown in FIGS. 3(a)-(c).

Figure 6:
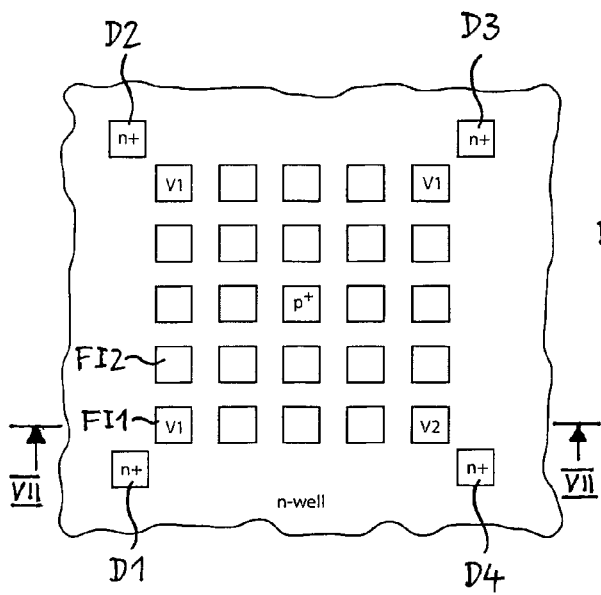
FIG. 6 shows a top view on an embodiment of a pixel with floating implants according to the invention.
Figure 7:
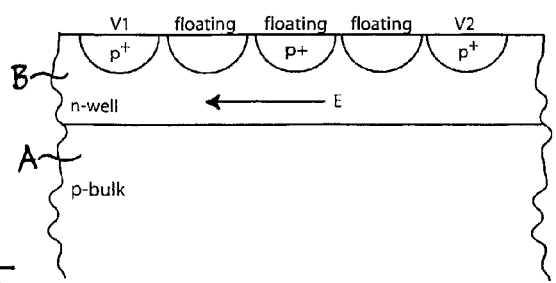
FIG. 7 shows a cross section through the embodiment of FIG. 6.

FIG. 6 shows a top view on an embodiment of the pixel with contact implants FI1, . . . , and floating implants FI2, . . ., according to the invention, and FIG. 7 shows a cross section along line VII-VII in FIG. 6. A one-or two-dimensional array of p+ implants in an n well B or an n+ buried channel is used to create a steplike lateral drift field. If the n well B is fully depleted and a few of the p+ contact implants FI1, . . . are held at fixed potentials, the remaining floating p+ implants FI2, . . . will immediately be biased to an intermediate potential due to the punch-through mechanism. By connecting one p+ contact implant at one edge to a potential V2 higher than the potential V1 of the rest of the p+ contact implants, a steplike drift field towards the high-potential corner builds up and photoelectrons e-will drift towards this edge. They can be read out through an n+ contact D4. By changing or reversing the potentials V2 and V1 among the edge-implants of the array, a modulated input signal In (cf. FIG. 2) can be demodulated.

Unlike the floating-gate implementation, the floating diffusions are not perfectly isolated against the surroundings. Therefore one can omit the high-ohmic connection which absorbs parasitic charges on the floating gates.

Unlike silicon drift detectors, which are used in particle physics, this concept only requires a single-sided processing of the wafer A and is compatible with standard CMOS processes. Existing silicon drift detectors neither use n wells or n+ buried channels, nor photogates.

Figure 8:
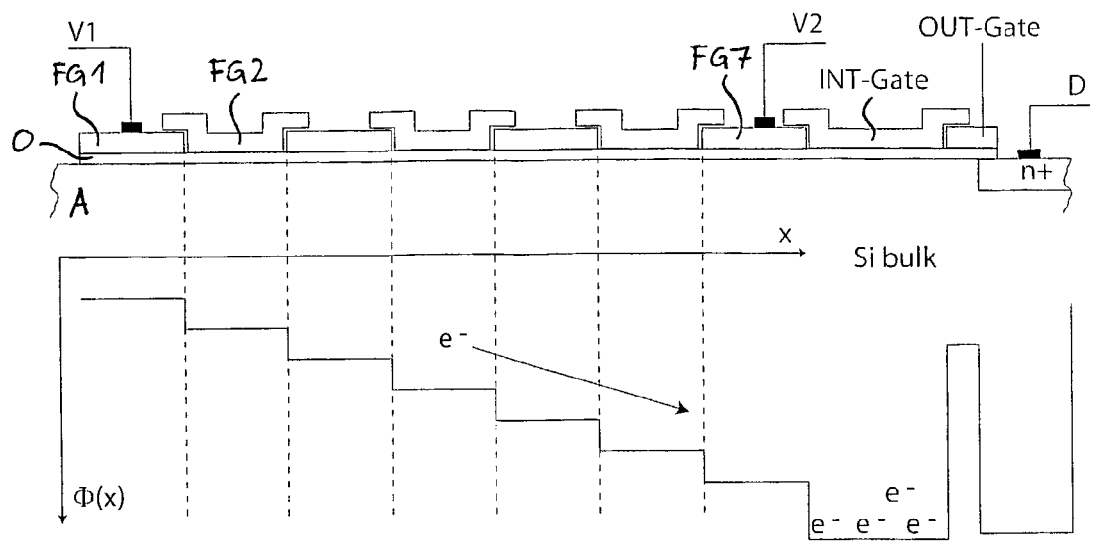
Figure 9:
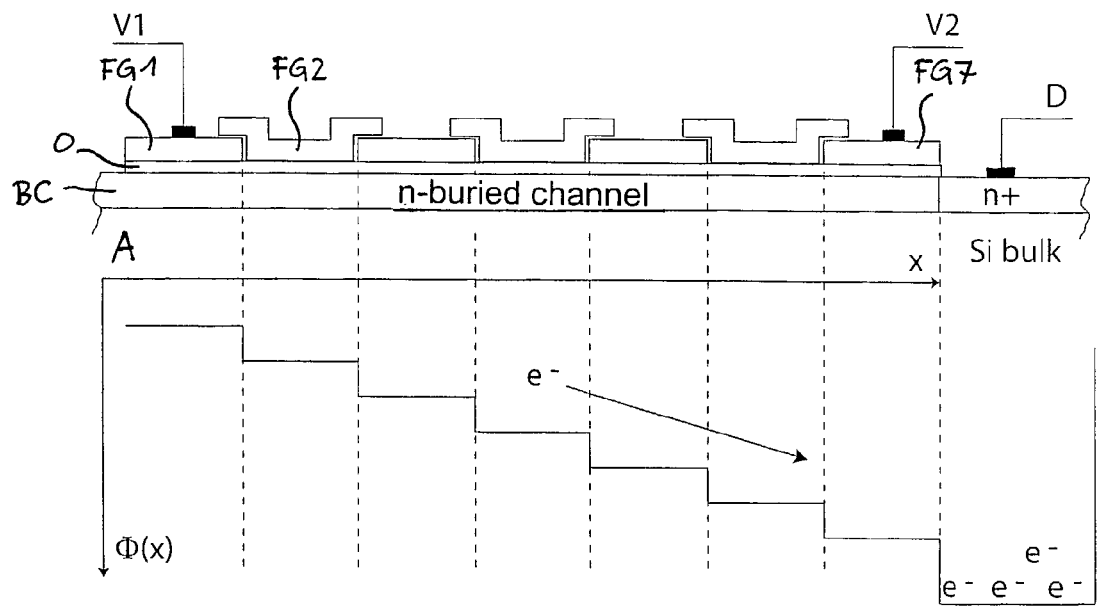

Possible optional improvements to the pixel embodiments discussed so far are shown in FIGS. 8 and 9 in cross sections. They include an additional integration gate INT-Gate (FIG. 8), an isolation gate OUT-Gate (FIG. 8) and a buried channel BC (FIG. 9). The buried-channel improvement can also be implemented without the INT-Gate and the OUT-Gate, whereas the INT-Gate and the OUT-Gate can also be used with the floating-implant embodiment (FIGS. 2, 6 and 7). With these embodiments it is possible to implement the photosensitive area in another material such as germanium or silicon-germanium in order to increase the spectral sensitivity.

The INT-Gate and OUT-Gate features as shown in FIG. 8 separate the integration node from the readout implant D, and reduce thus the readout noise. According to this embodiment of the invention, photocharge is accumulated in the potential well created under the floating INT-Gate. For reading out the accumulated photocharge, the potentials of the INT-Gate and V2 are reduced so that the accumulated photocharge is transferred into the region of the readout implant D. Any of the circuits illustrated in FIGS. 3(*a*)-3(*c*) can be used for the readout.

The buried channel BC of FIG. 9 increases the depletion zone below the gates FG1-FG7 and helps to collect and transfer most of the photogenerated charge carriers. Furthermore, it increases the lateral fringing fields, which are important for a good charge transfer efficiency.

If the electric coupling between the gates or implants is not sufficient for a specific application, it can be further increased with external capacitors EC, as indicated in FIG. 10. If necessary, also an external resistive coupling ER can be added.

In the dynamic operation mode, the pixel according to the invention is illuminated with radiation In modulated with a given modulation frequency. Such modulated radiation, preferably in the radio-frequency (RF) range, may be emitted by a light source allocated to the image sensor, and reflected by objects in the scene to be sensed. The steplike lateral electric field is periodically changed, so that charge carriers are stored in at least two charge-storage areas which are laterally adjacent to the active area, but geometrically separated and electrically isolated from the active area.

In a preferred embodiment, each period of the modulation frequency is divided into a number of intervals. There may be for instance four intervals corresponding to phase delays of 0°, 90°, 180° and 270°. A separate charge-storage area is provided for each time interval, and charge carriers are stored in the corresponding charge-storage area during each time interval. Preferably, the charge carriers are stored in the charge-storage areas over more than one period of the modulation frequency. The charge carriers stored in the charge-storage areas are then read out.

Demodulation parameters such as the phase, the offset and/or the amplitude of the incident radiation In can be calculated from the charge carriers stored in the corresponding charge-storage areas. From the demodulation parameters, a conventional two-dimensional intensity image and the target distance can be determined simultaneously. Thus, the image sensor according to the invention is capable of three-dimensional imaging in real time.

This invention is not limited to the preferred embodiments described above, to which variations and improvements may be made, without departing from the scope of protection of the present patent.

LIST OF REFERENCE SIGNS

A Semiconductor substrate
B Well
BC Buried channel
C, CE Integrating capacitor
C1, C2 Electrode contacts
D Accumulating diffusion
EC External capacitor
ER External resistor
FG Floating gate or contact area
FI Floating implant or contact area
FR Feedback resistor
In Incident radiation
INT-Gate Integration gate
O Insulator layer
OP Operational amplifier
OUT-Gate Isolation gate
Q Photocharge
R Reset gate
SR Reset switch
TR Reset transistor
TS Source-follower transistor
V Output voltage
VD Drain voltage
VR Reset voltage
V1, V2 Voltages applied to contacts C1, C2
x Horizontal coordinate
Φ(x) Potential distribution

The invention claimed is:

1. A pixel for use in an image sensor, comprising:
an active area for converting incident radiation into charge carriers of a first and a second charge type,
charge-separation areas located in said active area for separating said charge carriers of the first charge type from said charge carriers of the second charge type, and
charge-storage for storing charge carriers of at least one charge type, said charge-storage being located in a charge-storage area which is laterally adjacent to said active area, but geometrically separated from said active area,
a readout node provided outside said active area, and
an isolation gate arranged between said active area and said readout node for electrically isolating said readout node from said active area,
wherein said charge-separation areas comprise
at least one floating area and
at least two contact areas provided with electric contacts for applying a voltage to said at least two contact areas, said contact areas being electrically insulated from said at least one floating area yet capacitively coupled to at least one of said at least one floating area to generate a lateral electric field to move charge carriers toward the charge storage.

2. The pixel according to claim 1, wherein said charge-separation areas comprise an arrangement of a plurality of floating areas, the arrangement being such that neighboring floating areas are electrically insulated from each other yet electrically coupled to each other.

3. The pixel according to claim 1, wherein said at least one floating area and said at least two contact areas have the same structure.

4. The pixel according to claim 1, wherein said at least one floating area is a floating photogate, said contact areas being capacitively coupled to at least one of said at least one floating photogate, and, in case of a plurality of floating photogates, neighboring floating photogates being capacitively coupled to each other.

5. The pixel according to claim 4, wherein said photogates and/or said contact areas are made of polysilicon.

6. The pixel according to claim 4, wherein a buried channel is provided in said active area below said photogates and said contact areas.

7. The pixel according to claim 1, wherein said charge-storage means comprise a floating diffusion or a floating gate.

8. The pixel according to claim 1, wherein at least one coupling capacitor and/or at least one coupling resistor is provided for coupling two neighboring floating areas and/or a contact area to an adjacent floating area.

9. The pixel according to claim 1, further comprising an electric circuit for reading out said charge carriers stored by said charge-storage.

10. The pixel according to claim 1, wherein said charge-storage comprises at least two distinct charge-storage areas.

11. An image sensor comprising a plurality of pixels arranged in a one- or two-dimensional array,
characterized in that said pixels are pixels according to claim 1.

12. The image sensor according to claim 11, wherein the image sensor is of the charged-coupled device type.

13. A method for sensing incident radiation, comprising:
converting the incident radiation into charge carriers of a first and a second charge type in an active area of a semiconductor material,
generating a lateral electric field at the semiconductor surface in said active area for separating said charge carriers of the first charge type from said charge carriers of the second charge type and transporting said charge carriers, wherein a plurality of floating areas is provided in said active area, and a voltage is applied to at least two contact areas provided in said active area to generate the lateral electric field, said contact areas being electrically insulated from said at least one floating area and capacitively coupled to at least one of said at least one floating area, and
storing charge carriers of at least one charge type in a charge-storage area which is laterally adjacent to said active area, but geometrically separated from said active area while isolating said charge-storage area from a readout node,
during read out, transferring said charge carriers from the charge-storage area to said readout node.

14. A method for sensing incident radiation modulated with a modulation frequency, comprising:
converting the incident radiation into charge carriers of a first and a second charge type in an active area of a semiconductor material,
generating a lateral electric field at the semiconductor surface in said active area for separating said charge carriers of the first charge type from said charge carriers of the second charge type and transporting said charge carriers, wherein an arrangement of a plurality of floating areas is provided in said active area, and a voltage is applied to at least two contact areas provided in said active area to generate said lateral electric field, said contact areas being electrically insulated from said at least one floating area and capacitively coupled to at least one of said at least one floating area,
periodically changing said lateral electric field synchronously with the modulation frequency of the incident radiation, and
storing charge carriers of at least one charge type in at least two charge-storage areas which are laterally adjacent to said active area, but geometrically separated and electrically isolated from said active area, characterized in
during read out, transferring said charge carriers from the charge-storage areas to readout nodes.

15. The method according to claim 14, wherein
each period of the modulation frequency is divided into a number of intervals,
a separate charge-storage area is provided for each time interval, and
charge carriers are stored in the corresponding charge-storage area during each time interval.

16. The method according to claim 15, wherein the charge carriers stored in said charge-storage areas are read out, and demodulation parameters are calculated from said charge carriers.

17. The method according to claim 15, wherein charge carriers are stored in said charge-storage areas over more than one period of the modulation frequency.

18. The method according to claim 16, wherein charge carriers are stored in said charge-storage areas over more than one period of the modulation frequency.

19. The pixel according to claim 9, wherein said charge-storage comprises at least two distinct charge-storage areas.

20. An image sensor comprising a plurality of pixels arranged in a one- or two-dimensional array,
characterized in that
said pixels are pixels according to claim 19.

21. The image sensor according to claim 11, wherein the image sensor is of the complementary-metal-oxide-semiconductor type.

22. The image sensor according to claim 11, wherein the image sensor is of the active-pixel-sensor type.

* * * * *

UNITED STATES PATENT AND TRADEMARK OFFICE
CERTIFICATE OF CORRECTION

PATENT NO. : 7,701,028 B2
APPLICATION NO. : 10/594642
DATED : April 20, 2010
INVENTOR(S) : Rolf Kaufmann et al.

It is certified that error appears in the above-identified patent and that said Letters Patent is hereby corrected as shown below:

In Claim 7, Column 11, Line 13, delete "means comprise" and insert --comprises--.

In Claim 14, Column 12, line 21, delete "characterized in".

Signed and Sealed this

First Day of June, 2010

David J. Kappos
*Director of the United States Patent and Trademark Office*